United States Patent [19]
Yokoyama et al.

[11] Patent Number: 5,515,984
[45] Date of Patent: May 14, 1996

[54] METHOD FOR ETCHING PT FILM

[75] Inventors: Seiichi Yokoyama; Yasuyuki Ito, both of Kashiwa; Shigeo Onishi; Jun Kudo, both of Nara; Keizo Sakiyama, Kashihara, all of Japan

[73] Assignee: Sharp Kabushiki Kaisha, Osaka, Japan

[21] Appl. No.: 377,405

[22] Filed: Jan. 24, 1995

[30] Foreign Application Priority Data

Jul. 27, 1994 [JP] Japan .................................. 6-175364

[51] Int. Cl.$^6$ ................................ B44C 1/22; C23F 1/02
[52] U.S. Cl. ..................... 216/41; 156/643.1; 156/656.1; 156/659.11; 216/57; 216/69; 216/75; 437/245; 252/79.1
[58] Field of Search ............................. 156/643.1, 646.1, 156/656.1, 659.11, 661.11; 216/41, 47, 57, 58, 67, 69, 72, 75; 437/201, 245, 246; 252/79.1

[56] References Cited

U.S. PATENT DOCUMENTS 5,244,536  9/1993  Tani et al. .............................. 216/75 X

FOREIGN PATENT DOCUMENTS 5-109668  4/1993  Japan .

OTHER PUBLICATIONS

Kasumi et al, "PT Etching By Magnetron Plasma", The Japan Society of Applied Physics 30a–ZE–3 1993, with partial English translation.
Nishikawa et al, "Platinum Etching and Plasma Characteristics in RF Magnetron and Electron Cyclotron Resonance Plasmas", Jpn. J. Appl. Phys., vol. 32, pp. 6102–6108, Dec. 1993.

*Primary Examiner*—William Powell
*Attorney, Agent, or Firm*—Nixon & Vanderhye

[57] ABSTRACT

A method for etching a Pt film of the present invention includes the steps of: forming an etching resistant film on a Pt film, followed by patterning; etching the Pt film by using as an etching mask the etching resistant film and by using, as an etching gas, a mixed gas containing oxygen gas and chlorine gas or chloride gas, during which layers made of $PtCl_xO_y$, or a mixture containing $PtCl_x$ and $PtO_y$ are formed on side walls of the etching resistant film and the Pt film; and removing the layers made of $PtCl_xO_y$, or the mixture containing $PtCl_x$ and $PtO_y$ with an acid by wet etching after the etching step.

4 Claims, 4 Drawing Sheets

5,515,984

METHOD FOR ETCHING PT FILM

BACKGROUND OF THE INVENTION

1. Field of the Invention

The present invention relates to a method for etching an electrode material for a capacitor using a ferroelectric film, and more particularly to a method for etching platinum (Pt) film.

2. Description of the Related Art

In recent years, ferroelectric non-volatile memory devices, using as a capacitor a ferroelectric thin film with spontaneous polarization, have been extensively developed. Examples of a material for the ferroelectric thin film include oxides such as PZT ($PbZr_xTi_{1-x}O_3$, lead titanate zirconate), $PbTiO_3$ (lead titanate), $BaTiO_3$ (barium titanate), and PLZT ($Pb_xLa_{1-x}Zr_yTi_{1-y}O_3$, lanthanum lead titanate zirconate).

In a case where a ferroelectric thin film is utilized for a ferroelectric non-volatile memory device, a Pt film is generally used as an electrode material because of its suitability for crystal growth of the ferroelectric film thereon. In the ferroelectric non-volatile memory device, memory cells are highly integrated, which necessitates microprocessing of the Pt film.

Conventionally, the Pt film has been processed by wet etching with aqua regia, ion milling with argon, etc. However, the microprocessing as described above is difficult to conduct by wet etching. As for ion milling using an inert gas (e.g., argon), there are problems such as a low rate of etching, contamination of the Pt film caused by re-adhering of etched material to the surface of the Pt film, and a pattern size shift caused by re-adhering of etched material to the side walls of the remaining portions of the Pt film after etching. In order to avoid such re-adhering of etched material, the amount of ions which are vertically incident upon a ferroelectric film is decreased by tapering the side walls of the remaining portions of the ferroelectric film after etching (e.g., see Japanese Laid-Open Patent Publication No. 5-109668). In this case, because of the tapered side walls, each line width of memories made of the ferroelectric film cannot be controlled with good precision. As means for overcoming such conventional problems involved in microprocessing, dry etching techniques have been studied (Nishikawa et al., Jpn. J. Appl. Phys. Vol. 32, 6102–6108 (1993); The Japan Society of Applied Physics 30a-ZE-3, Spring Meeting in 1993). Specifically, dry etching techniques for etching a Pt film with chlorine ($Cl_2$) gas or hydrogen bromide (HBr) gas using a resist have been studied. However, according to such dry etching using a resist, a selection ratio between a resist and Pt is low, so that the resist is also partially etched together with the Pt to be tapered, causing a pattern size shift.

The problems involved in the prior art will be described with reference to FIGS. 4A through 4C. In these figures, the reference numeral 21 denotes a silicon substrate, 22 an NSG film, 23 a Ti film, 24 a TiN film, 25 a Pt/Ti film, 26 a Pt film, 27 a PZT film, 28 an etching mask, 29 remaining Pt, 30 side wall deposited films, and 31 a residue. For example, as shown in FIG. 4A, the PZT film 27 is patterned, and then, the Pt film 26 and the Pt/Ti film 25 are dry-etched with $Cl_2$ gas. In this case, the selection ratio between the resist and Pt is low, so that part of the Pt remains (remaining Pt 29) as shown in FIG. 4B. When etching is further conducted, the remaining Pt 29 works as an etching mask to cause a residue 31 as shown in FIG. 4C.

As described above, conventional microprocessing techniques of the Pt film respectively have problems.

SUMMARY OF THE INVENTION

The method for etching a Pt film of the present invention, includes the steps of:

forming an etching resistant film on a Pt film, followed by patterning;

etching the Pt film by using as an etching mask the etching resistant film and by using, as an etching gas, a mixed gas containing oxygen gas and chlorine gas or chloride gas, during which layers made of $PtCl_xO_y$ or a mixture containing $PtCl_x$ and $PtO_y$ are formed on side walls of the etching resistant film and the Pt film; and removing the layers made of $PtCl_xO_y$ or the mixture containing $PtCl_x$ and $PtO_y$ with an acid by wet etching after the etching step.

Alternatively, a method for etching a Pt film of the present invention includes the steps of:

forming an insulating film, a Ti film, a TiN film, a Ti film, a Pt film, and a ferroelectric film on a substrate in a successive manner;

forming an etching resistant film on the ferroelectric film, followed by patterning;

etching the ferroelectric film by using the patterned etching resistant film as an etching mask;

etching the Pt film by using, as an etching gas, a mixed gas containing oxygen gas and chlorine gas or chloride gas under the conditions that a temperature of the substrate is in the range of 100° C. to 400° C. and a ratio of a flow rate of the oxygen gas with respect to a total flow rate of the mixed gas is 1% or more and less than 50%, during which layers made of $PtCl_xO_y$ or a mixture containing $PtCl_x$ and $PtO_y$ on side walls of the etching resistant film, the ferroelectric film, and the Pt film; and removing the layers made of $PtCl_xO_y$ or a mixture containing $PtCl_x$ and $PtO_y$ with an acid by wet etching after the etching step.

In one embodiment of the present invention, the above-mentioned method uses an Electron Cyclotron Resonance (ECR) plasma etching apparatus.

In another embodiment of the present invention, a ratio of a flow rate of the oxygen gas with respect to a total flow rate of the mixed gas is 10% or more and less than 40%.

Thus, the invention described herein makes possible at least one of the advantages of (1) providing microprocessing of a Pt film with high precision without a pattern size shift and (2) providing a method for etching with high anisotropy without forming any taper.

These and other advantages of the present invention will become apparent to those skilled in the art upon reading and understanding the following detailed description with reference to the accompanying figures.

DESCRIPTION OF THE PREFERRED EMBODIMENTS

Hereinafter, the present invention will be described by way of an illustrative example with reference to the drawings.

Example

Referring to FIGS. 1A through 1F, a method for etching a Pt film of an Example according to the present invention will be described.

Figure 2:
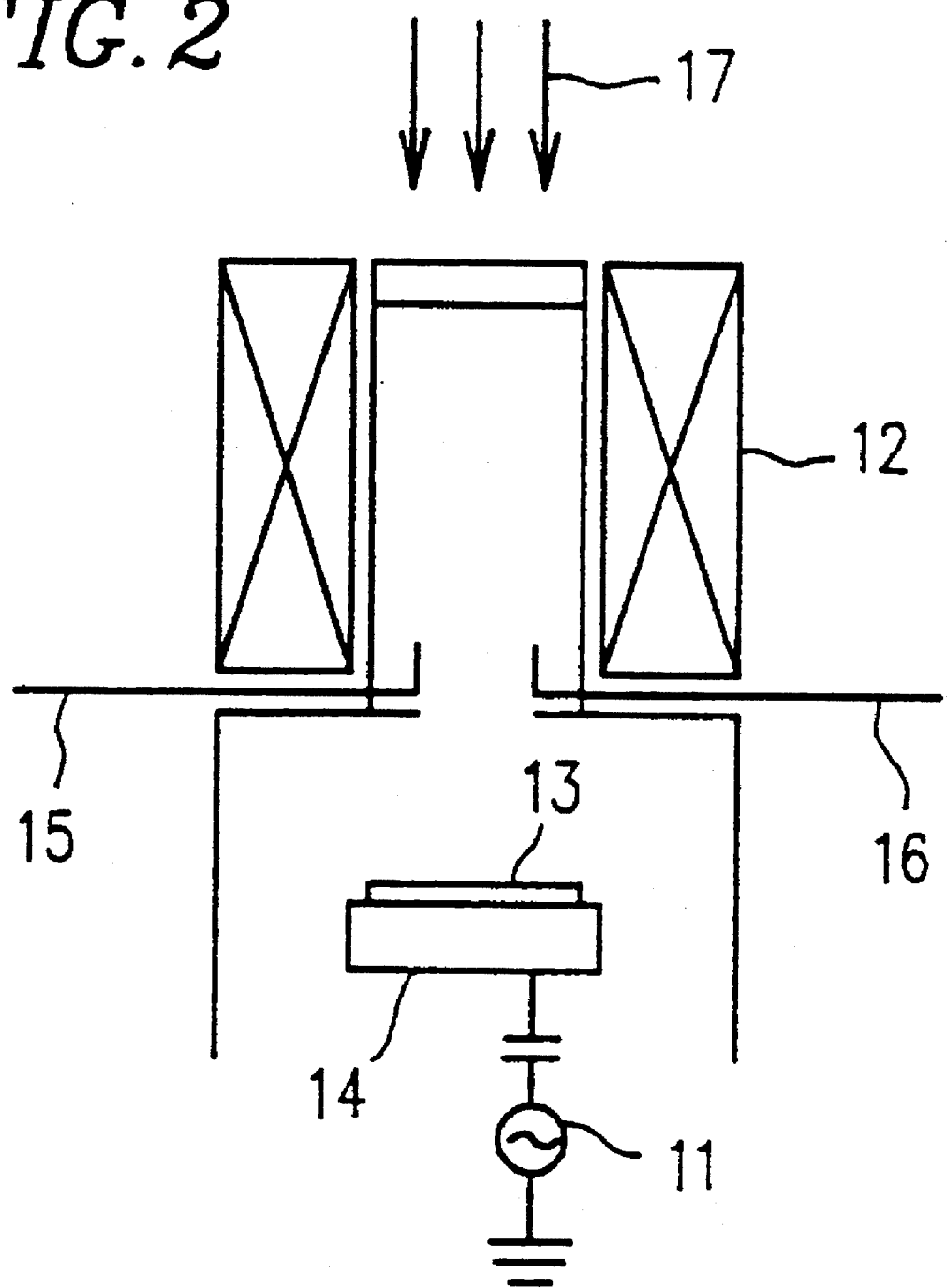
FIG. 2 is a view schematically showing an ECR plasma etching apparatus used for an Example according to the present invention.

The method for etching a Pt film of this Example can be implemented by using a device for generating high-density plasma (e.g., helicon wave plasma (HWP), inductive coupling plasma (ICP)) at a low pressure, such as an ECR plasma etching apparatus as shown in FIG. 2. Referring to FIG. 2, the ECR plasma etching apparatus includes a high frequency power source 11, solenoid coils 12, an electrode 14, a $Cl_2$ gas inlet 15, and $O_2$ gas inlet 16. A wafer 13 is mounted on the electrode 14. ECR plasma is generated by a microwave 17 and a magnetic field caused by the solenoid coils 12.

Figure 1A:
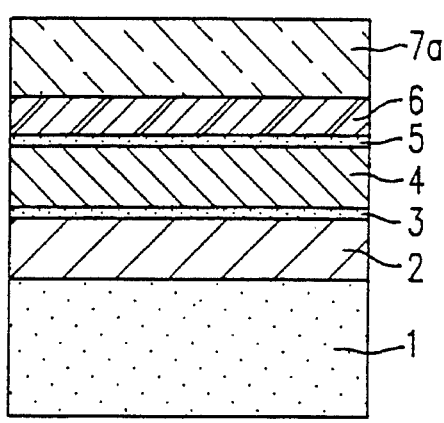
FIGS. 1A through 1F are cross-sectional views showing the steps of a method for etching a Pt film of an Example according to the present invention.

Referring to FIG. 1A, the first step of the method for etching a Pt film according to the present invention will be described below.

An NSG film 2 having a thickness of about 300 nm as an insulating layer is formed on a silicon substrate 1 by chemical vapor deposition (CVD). Then, a Ti film 3 having a thickness of about 20 nm is formed on the NSG film 2 by sputtering at an argon flow rate of 85 SCCM and an RF power of 3 kW under a pressure of 2.5 mTorr. Thereafter, a TiN film 4 having a thickness of about 200 nm as a barrier layer is formed on the Ti film 3 by sputtering at an argon flow rate of 58 SCCM, a nitrogen flow rate of 76 SCCM, and an RF power of 5 kW under a pressure of 4 mTorr. The Ti film 3 enhances the adhesion between the NSG film 2 and the TiN film 4. Then, a Ti film 5 having a thickness of about 20 nm is formed on the TiN film 4 by sputtering at an argon flow rate of 85 SCCM and an RF power of 3 kW under a pressure of 2.5 mTorr. A Pt film 6 having a thickness of about 100 nm as a lower electrode is formed on the Ti film 5 by sputtering at an argon flow rate of 120 SCCM and an RF power of 2 kW under a pressure of 4 mTorr. The Ti film 5 enhances the adhesion between the TiN film 4 and the Pt film 6. A ferroelectric PZT film 7a is formed on the Pt film 6 by a sol-gel method. The PZT film 7a is formed by coating a sol-gel solution of a precursor of PZT onto the Pt film 6 by using a spin coater and pre-baking the sol-gel solution coated on the Pt film 6 at 400° C. for one hour.

Figure 1D:
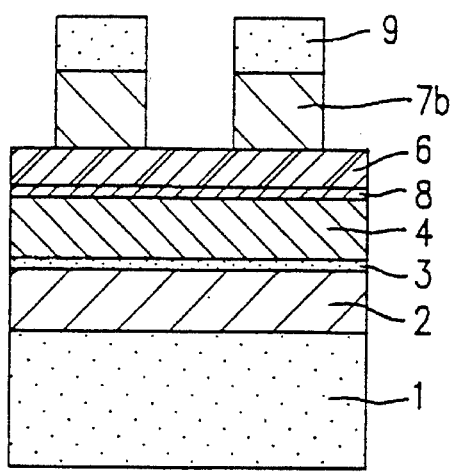
Figure 1B:
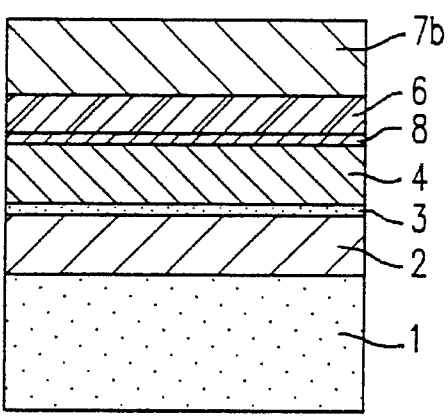

Referring to FIG. 1B, the second step of the method for etching a Pt film of an Example according to the present invention will be described below.

The PZT film 7a is baked by rapid thermal annealing (RTA) at 600° C. for 30 seconds to obtain a PZT film 7b. The PZT film 7b thus obtained has a thickness of about 250 nm. At this time, Pt and Ti form a eutectic between the Pt film 6 and the TiN film 4 to provide a Pt/Ti film 8. Furthermore, the morphology of the Pt film 6 as a lower electrode becomes an aggregation of grains.

Figure 1E:
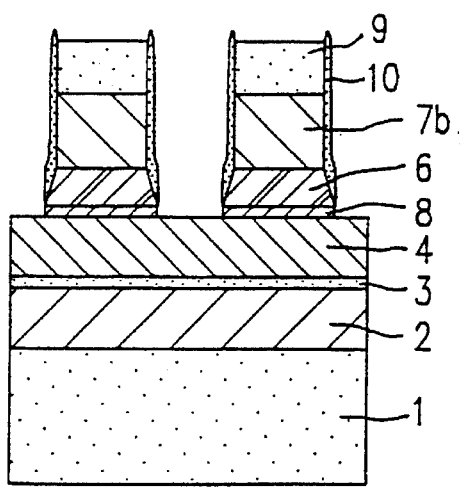
Figure 1C:
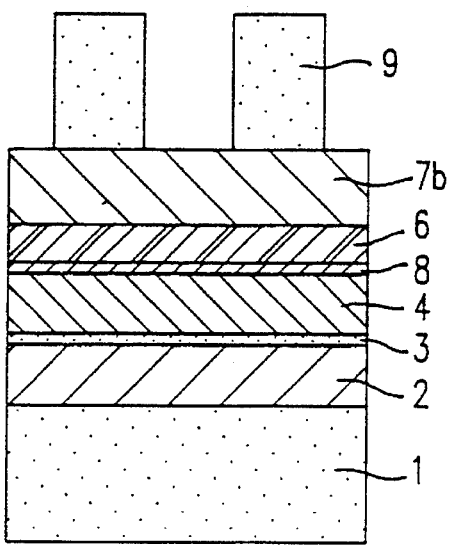

Referring to FIG. 1C, the third step of the method for etching a Pt film of an Example according to the present invention will be described below.

A spin on glass (SOG) film 9 having a thickness of 1 μm as an etching resistant film is formed on the PZT film 7b by using a spin coater, followed by being baked. It is noted that for using the SOG film 9 as an etching mask, the reaction between the SOG film 9 and the PZT film 7b should be suppressed by keeping the temperature of the silicon substrate 1 preferably in the range of 100° C. to 400° C. In place of the SOG film 9, an oxide mask such as an NSG film can be used as the etching resistant film.

Next, the SOG film 9 is patterned to squares with a size of 0.8 to 2.5 μm by a photolithography technique using a resist to obtain an etching mask. The SOG film 9 is etched by using a microwave plasma etching apparatus at a $CF_4$ flow rate of 50 SCCM, a microwave power of 200 mA, and an RF power of 40 W under a pressure of 5 mTorr. Thereafter, the resist is removed by ashing.

Referring to FIG. 1D, the fourth step of the method for etching a Pt film of an Example according to the present invention will be described below.

The PZT film 7b is etched with the ECR plasma etching apparatus as shown in FIG. 2, by introducing a mixture of Ar gas and $Cl_2$ gas as an etching gas at a flow rate of 63 SCCM and 27 SCCM, respectively, under the conditions of a pressure of 1.4 mTorr, a microwave power of 1000 W, an RF power of 100 W, and a substrate temperature of 300° C. The substrate temperature at a time of etching the PZT film 7b is preferably in the range of 100° C. to 400° C. In a case where the substrate temperature is less than 100° C., a halide of lead is not volatilized, so that the PZT film 7b is not sufficiently etched. In a case where the substrate temperature exceeds 400° C., an undesired reaction may be effected at an interface between the etching mask 9 formed of SOG and the PZT film 7b. Furthermore, the ferroelectric characteristics may be changed.

In order to obtain stable plasma by the ECR plasma etching apparatus, the vacuum degree at a time of etching the PZT film 7b is preferably in the range of 1 to 10 mTorr, more preferably in the range of 1 to 3 mTorr.

Referring to FIG. 1E, the fifth step of the method for etching a Pt film of an Example according to the present invention will be described below.

The Pt film 6 is etched with the ECR plasma etching apparatus as shown in FIG. 2, by introducing as an etching gas $O_2$ and $Cl_2$ at a flow rate of 9 SCCM and 81 SCCM, respectively, under the conditions of a pressure of 1.4 mTorr, a microwave power of 1000 W, an RF power of 100 W, and a substrate temperature of 300° C. The substrate temperature at a time of etching the Pt film 6 is preferably in the range of 100° C. to 400° C. In a case where the substrate temperature is less than 100° C., side wall deposited films 10 (i.e., layers made of $PtCl_xO_y$, or a mixture containing $PtCl_x$ and $PtO_y$) described later are not sufficiently formed. In a case where the substrate temperature exceeds 400° C., the ferroelectric characteristics may be changed.

In order to obtain stable plasma by the ECR plasma etching apparatus, the vacuum degree at a time of etching the Pt film 6 is preferably in the range of 1 to 10 mTorr, more preferably in the range of 1 to 3 mTorr.

A mixed gas containing $O_2$ gas and $Cl_2$ gas is preferably used as the etching gas. When $O_2$ gas is contained in the etching gas, two advantages are obtained. One of the advantages is that when oxygen is contained in the etching gas, the TiN film is hardly etched to enhance the selectivity of etching. The other advantage is that since Pt is oxidized during etching, side wall deposited films made of oxygen-containing compound such as $PtO_y$ are formed. It is known that such a compound, i.e., $PtO_y$ is dissolved in chloric acid. Thus, the compound can be easily removed by wet etching described later. The ratio of the flow rate of $O_2$ gas with respect to the total flow rate of the mixed gas is preferably 1% or more and less than 50%, more preferably 10% or more and less than 40%. In a case where the ratio of the flow rate of $O_2$ gas is 50% or more, the Pt/Ti film 8 between the Pt film 6 and the TiN film 4 is not sufficiently etched. By prescribing the ratio of the flow rate of $O_2$ gas to be less than 50%, the Pt film 6 and the Pt/Ti film 8 will have a sufficient selection ratio with respect to the TiN film 4. In the present example, the selection ratio of Pt/Ti film 8 and the Pt film 6 to the TiN film 4 exceeds 10; therefore, the Pt film 6 and the Pt/Ti film 8 can be completely removed. As a halogen gas, $Cl_2$ gas or a chloride gas, which are more readily volatilized compared with other halogen gases, are preferably used. In the present example, $Cl_2$ gas is used. Alternatively, chloride gases such as $CCl_4$ and $CHCl_3$ can be used.

By using the above-mentioned mixed gas, layers, that is, side wall deposited films 10 made of $PtCl_xO_y$ or a mixture containing $PtCl_x$ and $PtO_y$ are formed on side walls of the Pt film 6, the PZT film 7b and the SOG film 9. The side wall deposited films 10 work as an etching mask to protect the side walls of the Pt film 6 and the PZT film 7b which are to be etched and to protect the side walls of the SOG film 9.

An RF power at a time of the above-mentioned etching is preferably in the range of 100 to 200 W. In a case where the RF power is less than 100 W, an etching rate is extremely decreased. In a case where the Rf power exceeds 200 W, there is a possibility that the PZT film 7b is damaged.

Figure 3:
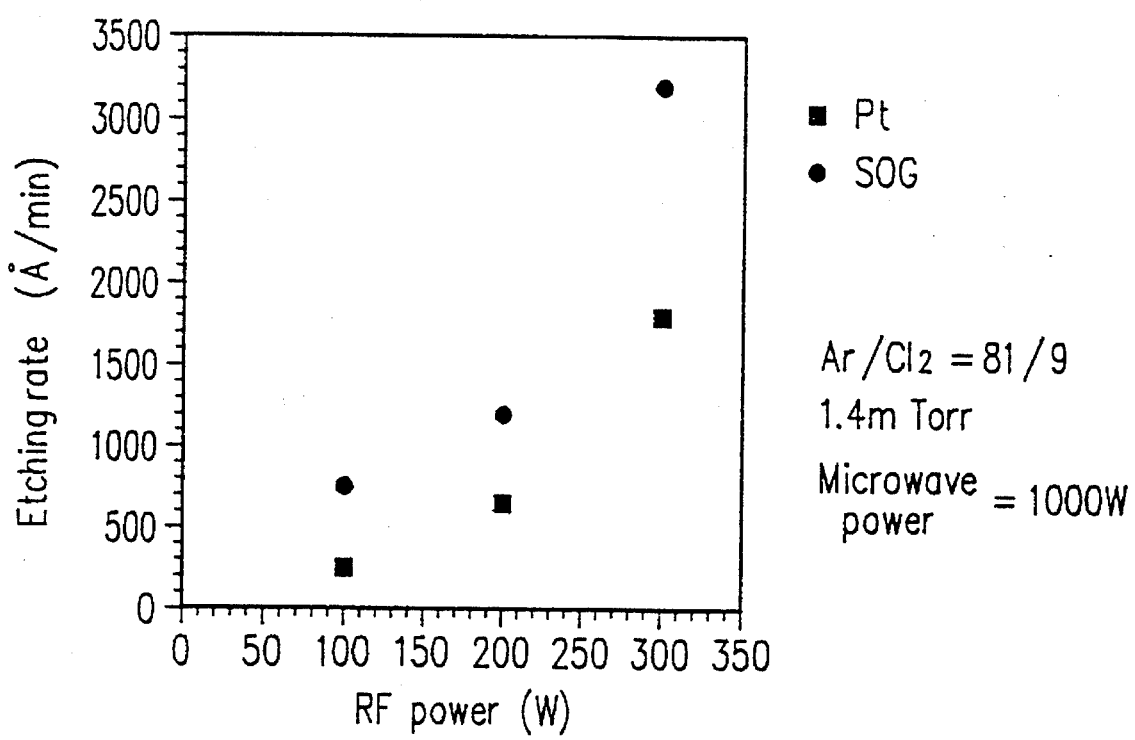
FIG. 3 is a graph showing the relationship between the RF power and the etching rate.
Figure 4A:
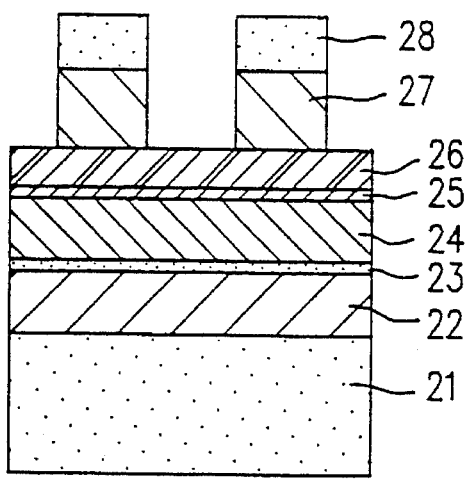
FIGS. 4A through 4C are views illustrating problems involved in a conventional etching method.
Figure 4B:
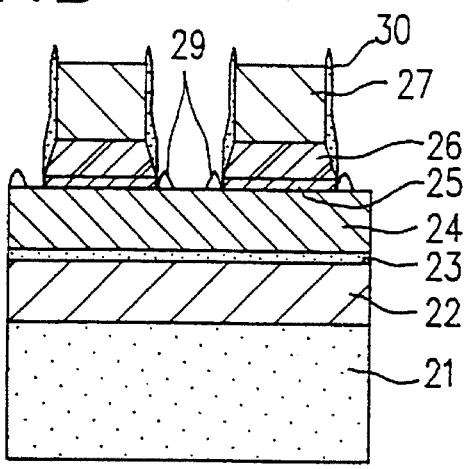
Figure 4C:
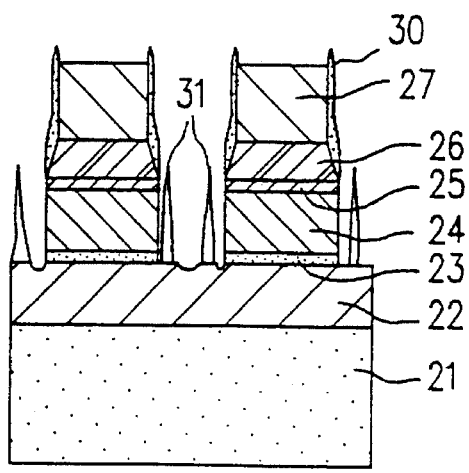

As shown in FIG. 3, when an RF power is increased, the etching rate of the Pt film 6 and the SOG film 9 is remarkably increased; on the other hand, the selection ratio between the Pt film 6 and the SOG film 9 is generally decreased. Thus, the RF power at a time of the above-mentioned etching is preferably in the range of 100 to 200 W. If the selectivity is considered, the RF power is preferably in the range of 100 to 150 W.

Figure 1F:
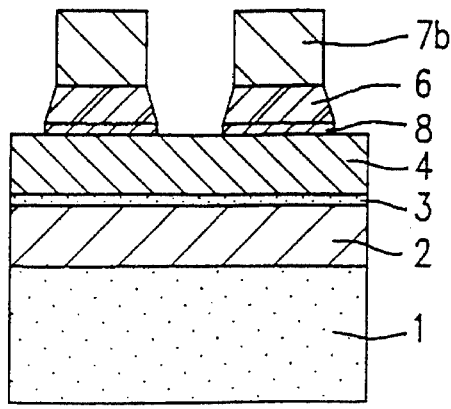

Referring to FIG. 1F, the final step of the method for etching a Pt film of an Example according to the present invention will be described below.

The side wall deposited films 10 are removed with an HCl aqueous solution of 35% concentration by wet etching for 10 minutes. As an etchant, an aqueous solution of sulfuric acid, an aqueous solution of phosphoric acid, an aqueous solution of nitric acid, or the like can be used in place of the HCl aqueous solution.

Finally, the SOG film 9 remaining as an etching mask is removed by etching using a microwave plasma etching apparatus at a $CF_4$ flow rate of 50 SCCM, a microwave power of 200 mA, and an RF power of 40 W under a pressure of 5 mTorr.

In a case where a Pt film with a thickness of 1000 Å is etched by conventional argon sputtering or dry etching, the Pt film is tapered at an angle of 45° and has a pattern size shift of 0.1 μm. However, according to the etching method of the present invention, the Pt film can be subjected to microprocessing with high precision without any pattern size shift.

As described above, according to the present invention, by using a mixed gas containing oxygen gas and chlorine gas or chloride gas, Pt is oxidized during etching, so that side wall deposited films made of $PtCl_xO_y$ or a mixture containing $PtCl_x$ and $PtO_y$ can be formed on the side walls of a silicon oxide film which is an etching mask and of a Pt film and a PZT film which are to be etched. The side wall deposited films protect the side walls of the Pt film and the PZT film, making it possible to etch these films with high anisotropy without causing a taper. Furthermore, the side deposited films can be readily removed with an acid by wet etching; therefore, the Pt film can be subjected to microprocessing with high precision without any pattern size shift.

According to the present invention, in a case where the TiN film is formed below the Pt film, the selectivity between Pt, a eutectic portion, and TiN is enhanced and the eutectic portion between the Pt film and the TiN film can be etched by prescribing the ratio of a flow rate of the above-mentioned oxygen gas to the total flow rate of the mixed gas to be less than 50%. Because of this, the Pt film can be subjected to microprocessing with high precision.

Furthermore, according to the present invention, by using a device for generating high-density plasma under a low pressure, such as an ECR plasma etching apparatus, etching with a high selection ratio is enabled at a high etching rate.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A method for etching a Pt film comprising the steps of:

forming an etching resistant film on a Pt film, followed by patterning;

etching the Pt film by using as an etching mask the etching resistant film and by using, as an etching gas, a mixed gas containing oxygen gas and chlorine gas or chloride gas, during which layers made of $PtCl_xO_y$ or a mixture containing $PtCl_x$ and $PtO_y$ are formed on side walls of the etching resistant film and the Pt film; and removing the layers made of $PtCl_xO_y$ or the mixture containing $PtCl_x$ and $PtO_y$ with an acid by wet etching after the etching step.

2. A method for etching a Pt film comprising the steps of:

forming an insulating film, a Ti film, a TiN film, a Ti film, a Pt film, and a ferroelectric film on a substrate in a successive manner;

forming an etching resistant film on the ferroelectric film, followed by patterning;

etching the ferroelectric film by using the patterned etching resistant film as an etching mask;

etching the Pt film by using, as an etching gas, a mixed gas containing oxygen gas and chlorine gas or chloride gas under the conditions that a temperature of the substrate is in the range of 100° C. to 400° C. and a ratio of a flow rate of the oxygen gas with respect to a total flow rate of the mixed gas is 1% or more and less than 50%, during which layers made of $PtCl_xO_y$ or a mixture containing $PtCl_x$ and $PtO_y$ on side walls of the etching resistant film, the ferroelectric film, and the Pt film; and removing the layers made of $PtCl_xO_y$ or a mixture containing $PtCl_x$ and $PtO_y$ with an acid by wet etching after the etching step.

3. A method for etching a Pt film according to claim 1, using an Electron Cyclotron Resonance (ECR) plasma etching apparatus.

4. A method for etching a Pt film according to claim 1, wherein a ratio of a flow rate of the oxygen gas with respect to a total flow rate of the mixed gas is 10% or more and less than 40%.

* * * * *